United States Patent
Lee

(10) Patent No.: US 11,229,143 B2
(45) Date of Patent: Jan. 18, 2022

(54) LIQUID-COOLING HEAT DISSIPATION SYSTEM CAPABLE OF REGULATING WATER QUALITY

(71) Applicant: ASIA VITAL COMPONENTS CO., LTD., New Taipei (TW)

(72) Inventor: Sung-Wei Lee, New Taipei (TW)

(73) Assignee: ASIA VITAL COMPONENTS CO., LTD., New Taipei (TW)

(*) Notice: Subject to any disclaimer, the term of this patent is extended or adjusted under 35 U.S.C. 154(b) by 259 days.

(21) Appl. No.: 16/666,420

(22) Filed: Oct. 29, 2019

(65) Prior Publication Data
US 2021/0123685 A1 Apr. 29, 2021

(51) Int. Cl.
H05K 7/20 (2006.01)
F28F 19/00 (2006.01)
F28D 21/00 (2006.01)

(52) U.S. Cl.
CPC ......... *H05K 7/20272* (2013.01); *F28F 19/00* (2013.01); *H05K 7/20781* (2013.01); *F28D 2021/0031* (2013.01)

(58) Field of Classification Search
CPC ... F28D 2021/0031; F28F 19/00; F28F 27/00; H05K 7/20272; H05K 7/2079
See application file for complete search history.

(56) References Cited

U.S. PATENT DOCUMENTS

| | | | | |
|---|---|---|---|---|
| 3,805,880 A * | 4/1974 | Lawlar | ...... | C02F 5/08 165/60 |
| 4,992,380 A * | 2/1991 | Moriarty | ...... | G01N 33/1893 436/55 |
| 7,594,430 B2 * | 9/2009 | Beardwood | ...... | C02F 1/76 73/61.62 |
| 9,420,729 B2 * | 8/2016 | Kelley | ...... | H05K 7/2079 |
| 2004/0050792 A1 * | 3/2004 | Bonds | ...... | F28F 19/00 210/652 |
| 2007/0102367 A1 * | 5/2007 | Owens | ...... | C02F 1/66 210/724 |
| 2011/0132579 A1 * | 6/2011 | Best | ...... | H05K 7/20772 165/104.31 |
| 2013/0105406 A1 * | 5/2013 | Van Der Wal | ...... | C02F 1/4691 210/748.16 |
| 2014/0202678 A1 * | 7/2014 | Goth | ...... | F28F 27/02 165/287 |

(Continued)

*Primary Examiner* — Devon Russell
(74) *Attorney, Agent, or Firm* — Demian K. Jackson; Jackson IPG PLLC

(57) ABSTRACT

A liquid-cooling heat dissipation system capable of regulating water quality includes a first liquid inlet, a first liquid outlet, a heat exchange unit, a sensation unit, a water quality regulating unit for containing and releasing an agent and a control unit. The heat exchange unit has a heat exchanger, a first pump and a mating opening connected with the water quality regulating unit. The sensation unit detects the pH value of a first working liquid and transmits a sensation signal to the control unit. The control unit compares the sensation signal with a preset pH value range to generate and transmit a comparison result to an external interface, whereby the water quality regulating unit is manually controlled to release the agent or not. Alternatively, according to the comparison result, the control unit automatically controls the water quality regulating unit to release the agent or not.

18 Claims, 6 Drawing Sheets

(56) References Cited

U.S. PATENT DOCUMENTS

| | | | |
|---|---|---|---|
| 2016/0153718 A1* | 6/2016 | Batscha | F28F 27/003 |
| | | | 137/11 |
| 2018/0116254 A1* | 5/2018 | Demoulin | B01J 41/05 |
| 2019/0101964 A1* | 4/2019 | Luxford | H05K 7/20272 |
| 2019/0145722 A1* | 5/2019 | Myers | F28F 27/00 |
| | | | 165/303 |
| 2019/0191593 A1* | 6/2019 | Wang | H05K 7/20272 |
| 2019/0314243 A1* | 10/2019 | MacCallum | A61H 1/00 |
| 2020/0187388 A1* | 6/2020 | Chiu | H05K 7/20145 |
| 2021/0068303 A1* | 3/2021 | Franz | G05B 19/042 |
| 2021/0187441 A1* | 6/2021 | Geronimi | C09K 3/18 |

* cited by examiner

LIQUID-COOLING HEAT DISSIPATION SYSTEM CAPABLE OF REGULATING WATER QUALITY

BACKGROUND OF THE INVENTION

1. Field of the Invention

The present invention relates generally to a liquid-cooling heat dissipation system capable of regulating water quality, and more particularly to a liquid-cooling heat dissipation system capable of monitoring water quality and pH value so as to adjust and control water quality and pH value.

2. Description of the Related Art

The advance of sciences and technologies leads to enhancement of convenience in human life. Especially, all the current various data processing and internet application must depend on the operation of electronic apparatuses. Therefore, the electronic apparatuses with high-speed processing performance and large storage capacity are widely applied to various businesses.

With the conventional IT, communication, industrial, traffic and transportation cabinet structure for containing various heat generation components taken as an example, the interior of the cabinet is a closed receiving space for receiving multiple heat generation components (such as central processing unit (CUP), microprocessor, chips, single-chip microcomputer or any other unit or device drivable by power to generate heat). Multiple water-cooling radiators are disposed in the receiving space and attached to the respective heat generation components. An internal working fluid is driven by a pump through a pipe body set to the water-cooling radiators. A fan is disposed in the cabinet to drive the air in the receiving space of the cabinet, whereby the working fluid absorbing the heat in the water-cooling radiators heat-exchanges with the air in the cabinet so as to achieve heat dissipation effect and lower the temperature of the respective heat generation components.

However, in the above heat dissipation circulation process, the heat exchange is simply performed inside the cabinet to dissipate the heat. In case such as multiple high-power-wattage central processing units are disposed in the cabinet, the water-cooling radiators and fans disposed in the cabinet and the air exhausted from the fan will relatively have higher temperature. Moreover, the cabinet has a closed space so that the hotter air will stagnate in the cabinet and can be hardly exhausted. As a result, the entire heat dissipation efficiency will be continuously deteriorated as a vicious cycle. Therefore, the heat cannot be dissipated in time so that the heat dissipation effect is very poor and the heat exchange efficiency is poor. In addition, after a period of time of heat exchange, the pH value of the working liquid in the water-cooling radiators will gradually become too acidic, (that is, the pH value is too low under pH 5.0). As a result, the pipe bodies and the water-cooling radiators will be seriously corroded and rusted and the lifetime of the entire heat dissipation system will be shortened.

It is therefore tried by the applicant to provide a liquid-cooling heat dissipation system capable of regulating water quality to solve the above problems existing in the conventional heat dissipation system.

SUMMARY OF THE INVENTION

It is therefore a primary object of the present invention to provide a liquid-cooling heat dissipation system capable of regulating water quality. The liquid-cooling heat dissipation system is able to adjust and control water quality and pH value.

It is a further object of the present invention to provide a liquid-cooling heat dissipation system capable of regulating water quality, which can monitor and control water quality and pH value and control water flow amount of the working liquid. Also, the liquid-cooling heat dissipation system can automatically supplement water and monitor/control system pressure.

It is still a further object of the present invention to provide a liquid-cooling heat dissipation system capable of regulating water quality, which has alert and reminding function.

To achieve the above and other objects, the liquid-cooling heat dissipation system capable of regulating water quality of the present invention includes a first liquid inlet, a first liquid outlet, a heat exchange unit, a sensation unit, a water quality regulating unit and a control unit. The heat exchange unit has a mating opening, a heat exchanger communicating with the first liquid inlet and a first pump communicating with the first liquid outlet and the heat exchanger. The first pump serves to drive a first working liquid, which has been heat-exchanged in the heat exchanger. The sensation unit has at least one pH value sensor disposed in a place where the first working liquid passes through for detecting the pH value of the first working liquid and generating a sensation signal corresponding to the pH value. The water quality regulating unit is connected with the mating opening. The water quality regulating unit is manually or automatically operable to control and release an agent contained in the water quality regulating unit to pass through the mating opening into the heat exchange unit, whereby the agent contacts and mixes with the working liquid. The control unit is connected with the sensation unit and the first pump. The control unit serves to compare the sensation signal with a preset pH value range to generate a comparison result and transmit the comparison result to an external interface, whereby the water quality regulating unit is manually controlled to release the agent or not to release the agent. Alternatively, according to the comparison result, the control unit automatically controls the water quality regulating unit to release the agent or not to release the agent. By means of the design of the liquid-cooling heat dissipation system of the present invention, the water quality and pH value can be monitored, adjusted and controlled. Also, the liquid-cooling heat dissipation system of the present invention is able to effectively control the water flow amount of the working liquids and has the function of automatically supplementing water and alert and reminding function and has the effect of monitoring/controlling system pressure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
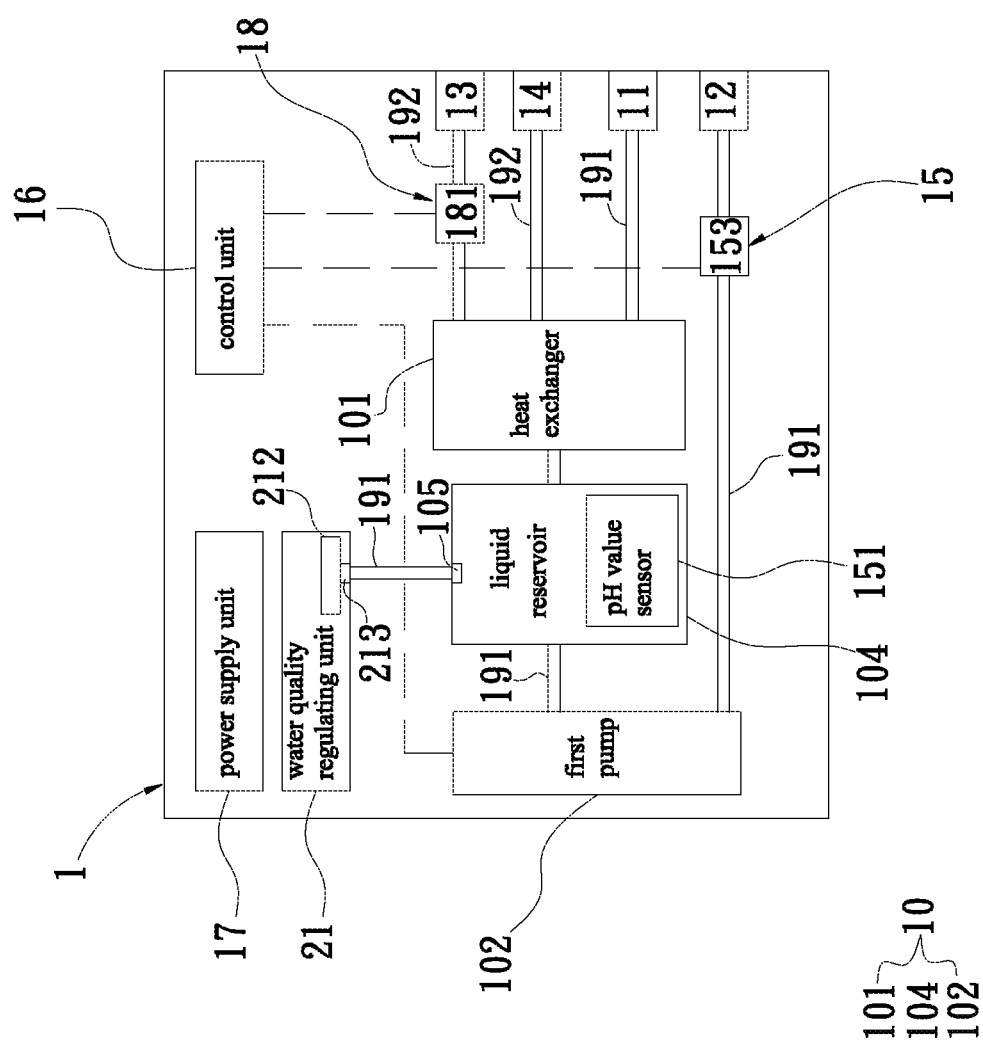
FIG. 1 is a block diagram of a first embodiment of the liquid-cooling heat dissipation system of the present invention.
Figure 2:
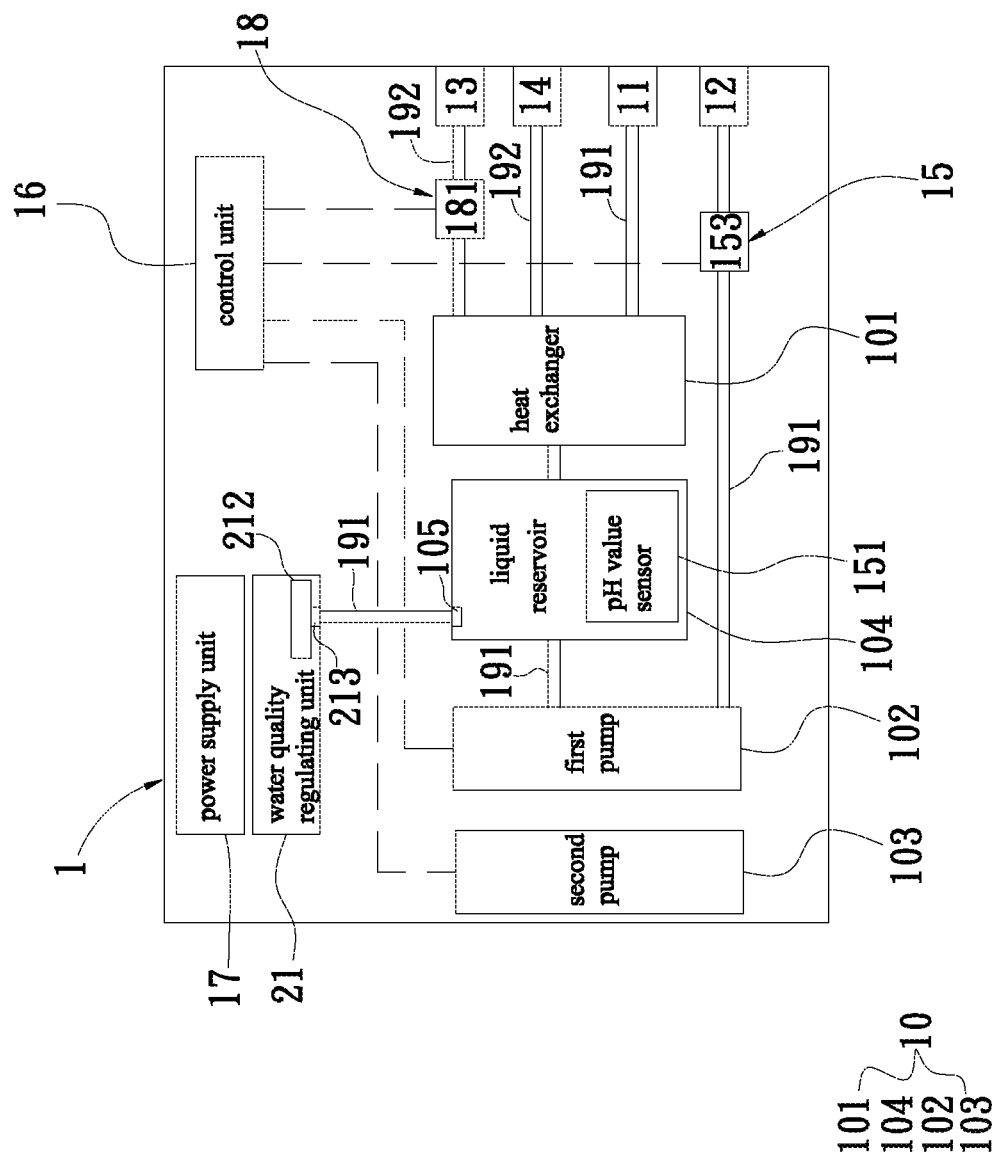
FIG. 2 is a block diagram of the first embodiment of the liquid-cooling heat dissipation system of the present invention in another aspect.
Figure 3:
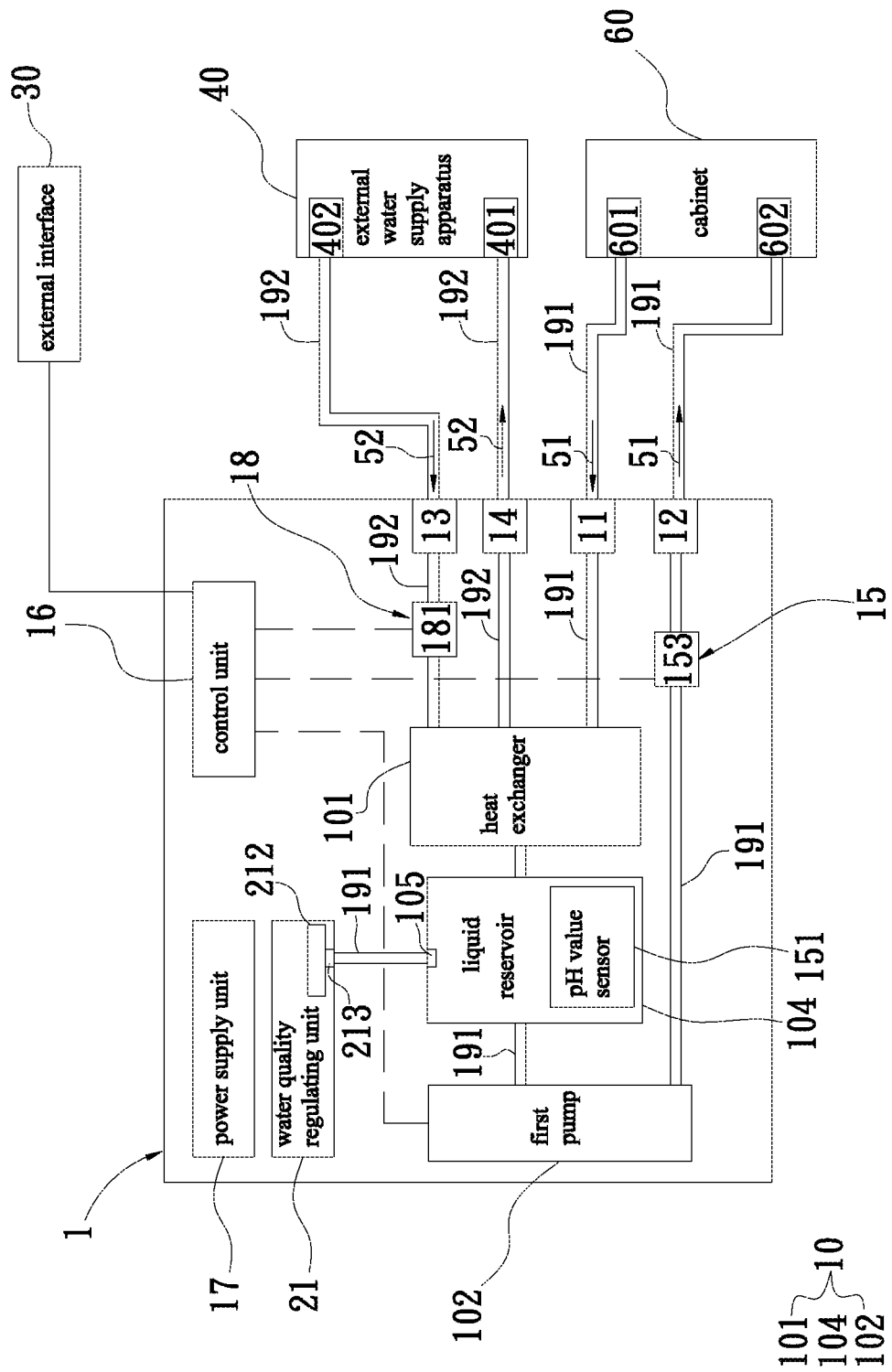
FIG. 3 is a block diagram of the first embodiment of the liquid-cooling heat dissipation system of the present invention, showing an application thereof.
Figure 3A:
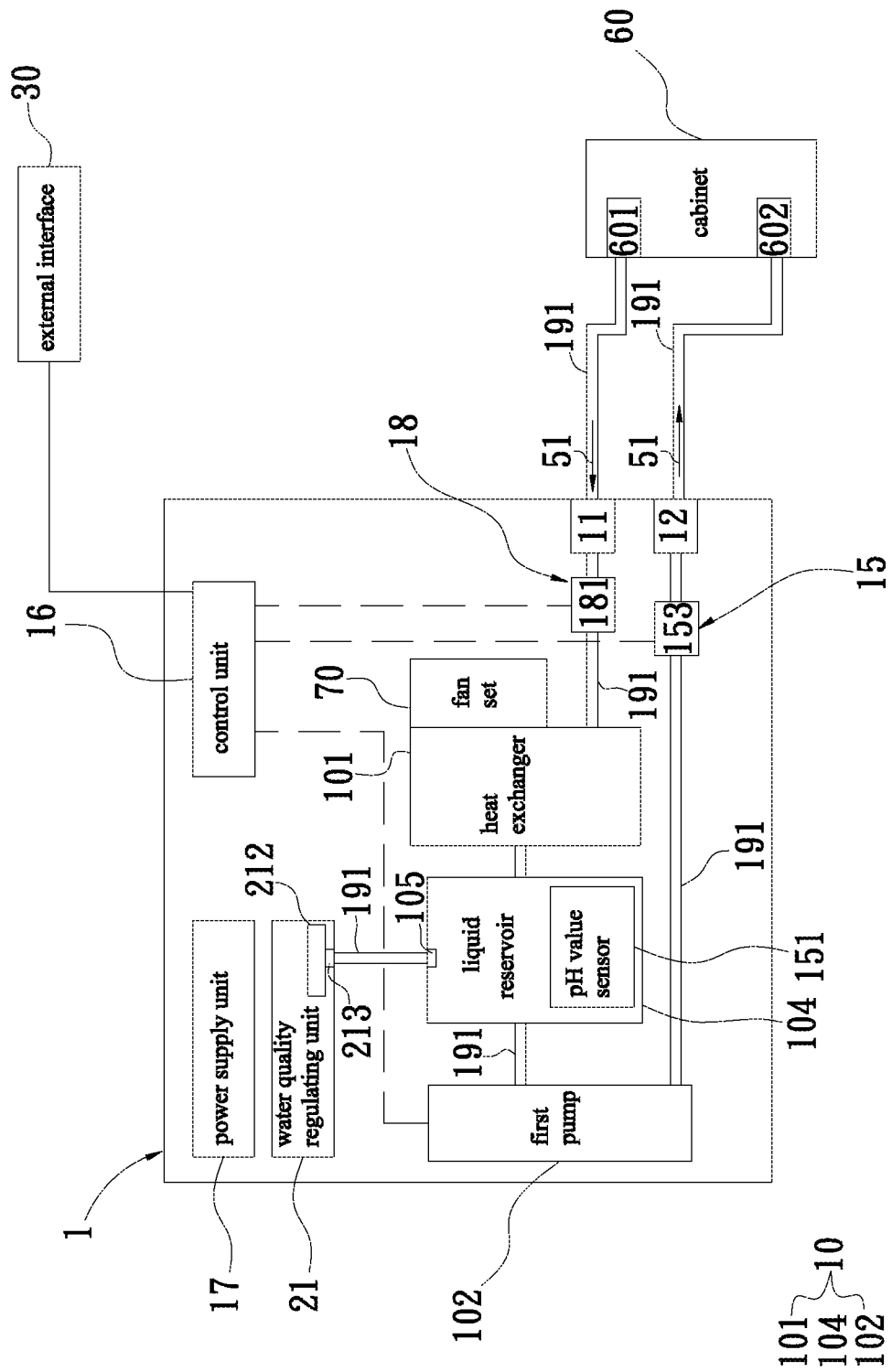
FIG. 3A is a block diagram of the first embodiment of the liquid-cooling heat dissipation system of the present invention in another aspect.

Please refer to FIGS. 1 to 3A. FIG. 1 is a block diagram of a first embodiment of the liquid-cooling heat dissipation system of the present invention. FIG. 2 is a block diagram of the first embodiment of the liquid-cooling heat dissipation system of the present invention in another aspect. FIG. 3 is a block diagram of the first embodiment of the liquid-cooling heat dissipation system of the present invention, showing an application thereof. FIG. 3A is a block diagram of the first embodiment of the liquid-cooling heat dissipation system of the present invention in another aspect. In the first embodiment, the liquid-cooling heat dissipation system 1 is, but not limited to, applied to a data center (such as a computer facility or a house) for illustration purposes. One or more cabinets 60 for storing information technology (IT) apparatuses (such as serves or network communication equipments) are placed in the data center such as a computer facility. The liquid-cooling heat dissipation system 1 of the present invention is positioned in the computer facility to control the flow supply of a first working liquid 51 (such as a coolant), regulate water quality and pH value, intelligently monitor/control water quality and pH value and water flow amount and system pressure and control water flow amount and water temperature and automatically supplement water. In addition to the above functions, in practice, the liquid-cooling heat dissipation system 1 of the present invention has other intelligent monitoring/controlling and reminding functions, for example, intelligent monitoring/controlling dew point and outlet water temperature and intelligent setting or alerting/reminding. The liquid-cooling heat dissipation system 1 includes a first liquid inlet 11, a first liquid outlet 12, a second liquid inlet 13, a second liquid outlet 14, a heat exchange unit 10, a sensation unit 15, a water quality regulating unit 21 and a control unit 16. The heat exchange unit 10 communicates with the first liquid inlet 11 and the first liquid outlet 12 via multiple first fluid pipelines 191. The heat exchange unit 10 communicates with the second liquid inlet 13 and the second liquid outlet 14 via multiple second fluid pipelines 192. In this embodiment, via the first fluid pipelines 191, the first liquid inlet 11 and the first liquid outlet 12 are correspondingly connected with a cabinet water inlet 601 and a cabinet water outlet 602 of the cabinet 60 and communicate therewith. The second liquid inlet 13 and the second liquid outlet 14 are respectively connected with an external water supply apparatus 40 (such as an icy water mainframe or cooling water tank) for providing a second working liquid 52 (such as a coolant) and communicate therewith. For example, the external water supply apparatus 40 is such as an icy water mainframe. Via the second fluid pipelines 192, a water inlet 401 and a water outlet 402 of the external water supply apparatus 40 are respectively correspondingly connected with the second liquid inlet 13 and the second liquid outlet 14 and communicate therewith. The temperature of the second working liquid 52 entering the second liquid inlet 13 is lower than the temperature of the first working liquid 51 exhausted from the first liquid outlet 12. Also, the temperature of the second working liquid 52 entering the second liquid inlet 13 is lower than the temperature of the first working liquid 51 of the first liquid inlet 11 and the temperature of the second working liquid 52 of the second liquid outlet 14.

The heat exchange unit 10 has a mating opening 105, a heat exchanger 101 communicating with the first liquid inlet 11, a first pump 102 communicating with the first liquid outlet 12 and a liquid reservoir 104 containing the first working liquid 51. The mating opening 105 is disposed in the heat exchange unit 10 through which the first working fluid 51 passes. In this embodiment, the mating opening 105 is disposed on one side (such as top side) of the liquid reservoir 104. The mating opening 105 is, but not limited to, correspondingly mated with the water quality regulating unit 21 and communicates therewith. In practice, the mating opening 105 can be alternatively disposed on one of the first fluid pipelines 191 or the first pump 102. The liquid reservoir 104 is disposed between the heat exchanger 101 and the first pump 102. The liquid reservoir 104 is respectively connected with the heat exchanger 101 and the first pump 102. In this embodiment, via the first fluid pipelines 191, the liquid reservoir 104 is connected with the heat exchanger 101 and the first pump 102. The liquid reservoir 104 serves to temporarily store the first working fluid 51 passing through the heat exchanger 101 as a buffer.

In this embodiment, the heat exchanger 101 is, but not limited to, a plate-type heat exchanger 101. The heat exchanger 101 serves as a place where the high-temperature working liquid (such as the high-temperature first working liquid 51 of the first liquid inlet 11) heat-exchanges with the low-temperature working liquid (such as the low-temperature second working liquid 52 of the second liquid inlet 13). The first liquid inlet 11 receives and collects the high-temperature first working liquid 51 passing through the electronic components (such as central processing units) of the IT apparatuses in one or multiple cabinets 60. The second liquid inlet 13 is for the low-temperature second working liquid 52 of outer side (such as the external water supply apparatus 40) without waste heat to enter the heat exchanger 101 of the liquid-cooling heat dissipation system 1. The first liquid outlet 12 is for the high-temperature first working liquid 51 to sequentially pass through the heat exchanger 101, the liquid reservoir 104 and the first pump 102 to lower the temperature (or be cooled) into low-temperature first working liquid 51, which is exhausted from the liquid-cooling heat dissipation system 1. The second liquid outlet 14 is for the low-temperature second working liquid 52 to pass through the heat exchanger 101 to become high-temperature second working liquid 52 carrying away waste heat, which is exhausted. In addition, via the first fluid pipelines 191, the first liquid outlet 12 and the first liquid inlet 11 are respectively correspondingly connected with the first pump 102 and one side of the heat exchanger 101 and communicate therewith. Via the second fluid pipelines 192, the second liquid outlet 14 and the second liquid inlet 13 are correspondingly connected with one side of the heat exchanger 101 (or the other side of the heat exchanger 101) and communicate therewith.

Therefore, the path from the first liquid inlet 11 to the first liquid outlet 12 is an inner circulation path of the liquid-cooling heat dissipation system 1. The path from the second liquid inlet 13 to the second liquid outlet 14 is an outer circulation path of the liquid-cooling heat dissipation system 1. The first and second working liquids 51, 52 in the inner and outer circulation paths respectively independently circulate within the circulation paths without communicating with each other. By means of the heat exchanger 101, the high-temperature working liquid (such as the high-temperature first working liquid 51 of the first liquid inlet 11) and the low-temperature working liquid (such as the low-temperature second working liquid 52 of the second liquid inlet 13) heat-exchange with each other. The heat of the high-temperature first working liquid 51 is transferred to the low-temperature second working liquid 52, whereby the temperature is lowered (or the first working liquid 51 is cooled) to become low-temperature first working liquid 51, which flows into the liquid reservoir 104 for storage. Then, by means of the first pump 102, the low-temperature first working liquid 51 in the liquid reservoir 104 is exhausted from the first liquid outlet 12 into the cabinet 60 to continue the water-cooling circulation for dissipating the heat. At the same time, after receiving the heat, the low-temperature second working liquid 52 becomes high-temperature second working liquid 52, which is exhausted from the second liquid outlet 14 to the external water supply apparatus 40. After cooled, the temperature of the first working liquid 51 is lower than the temperature of the high-temperature first working liquid 51.

After heat-exchanged in the heat exchanger, the low-temperature first working liquid 51 is stored in the liquid reservoir 104, whereby the first pump 102 serves to drive the low-temperature first working liquid 51 to pass through the first liquid outlet 12 to be exhausted into the cabinet 60. The sensation unit 15 has at least one pH value sensor 151 and at least one temperature sensor 153. The pH value sensor 151 and the temperature sensor 153 are disposed in a place where the first working liquid 51 passes through. In this embodiment, the pH value sensor 151 is disposed in the liquid reservoir 104 to detect the pH value of the first working liquid 51 and generate a sensation signal corresponding to the pH value and transmit the sensation signal to the control unit 16. The temperature sensor 153 is disposed in the first fluid pipeline 191 in adjacency to the first liquid outlet 12 to detect the temperature of the low-temperature first working liquid 51 exhausted from the first liquid outlet 12 and generate a temperature sensation signal and the transmit the temperature sensation signal to the control unit 16. In practice, the numbers of the pH value sensor 151 and the temperature sensor 153 are not limited. According to the precision of water quality and pH value and the temperature requirement of respective positions in the system, a user can previously design and adjust to dispose more than two pH value sensors 151 and more than two temperature sensors 153 in a place where the first working liquid 51 passes through. For example, two pH value sensors 151 are respectively disposed in the liquid reservoir 104 and any of the first fluid pipelines 191 (such as an adjacent first fluid pipeline 191) to detect the pH value of the working liquid in the liquid reservoir 104 and the pH value of the first working liquid 51 in the first fluid pipeline 191 and generate a corresponding sensation signal and transmit the sensation signal to the control unit 16. The two temperature sensors 153 are respectively disposed in the first fluid pipeline 191 in adjacency to the first liquid outlet 12 and the second fluid pipeline 192 in adjacency to the second liquid outlet 14 to detect the temperature of the low-temperature first working liquid 51 and the temperature of the high-temperature second working liquid 52.

In a preferred embodiment, as shown in FIG. 2, the heat exchange unit 10 has a second pump 103. The second pump 103 is connected with the first pump 102 in parallel or serially. The first and second pumps 102, 103 serve as a backup for each other. Therefore, in case any of the first and second pumps 102, 103 is damaged, the other can take over to continuously drive the first working liquid 51 so as to achieve backup function and uninterruptedly drive the first working liquid 51 to work.

In a modified embodiment, a filter (not shown) is disposed in the liquid reservoir 104. The filter serves to filter off and isolate the impurities or alien articles in the first working liquid 51, which is cooled through the heat exchanger 101. Accordingly, the impurities or alien articles of the first working liquid 51 will remain in the liquid reservoir 104. The first pump 102 drives the first working liquid 51 filtered by the filter in the liquid reservoir 104 to pass through the first liquid outlet 12 and be exhausted into the cabinet 60. Therefore, the working liquid can keep having a clean water quality to enhance the heat transfer efficiency.

Please refer to FIGS. 1 and 3. An agent (not shown) is contained in the water quality regulating unit 21. The water quality regulating unit 21 can be manually or automatically operated to control and release the agent to pass through the mating opening 105 into the heat exchange unit, whereby the agent can contact and mix with the first working liquid 51. After mixed, the pH value of the first working liquid 51 reaches a predetermined pH value range. In this embodiment, the agent is, but not limited to, a pH value agent having the form of a tablet. In practice, the agent can be alternatively a complex agent such as a pH value and anticorrosion complex agent or a pH value and anti-boiling complex agent or a pH value and anticorrosion complex agent or a pH value, anticorrosion, anti-boiling and antirust complex agent or other complex agent (such as sterilization and descaling complex agent). In addition, the agent can be liquid agent, powder agent, particle agent or paste agent. The water quality regulating unit 21 has a receiving space 212 for receiving the agent and an agent outlet 213 connected with the mating opening 105. The receiving space 212 respectively communicates with the agent outlet 213 and the mating opening 105. In this embodiment, the agent outlet 213 is connected with the mating opening 105 via a corresponding first fluid pipeline 191. The agent outlet 213 is for releasing the agent into the mating opening 105. The agent outlet 213 of the water quality regulating unit 21 communicates with the liquid reservoir 104 via the first fluid pipeline 191 through the mating opening 105. Accordingly, the agent of the receiving space 212 can be released through the mating opening 105 into the liquid reservoir 104.

In practical application of the present invention, an agent addition control valve (not shown) is disposed in the agent outlet 213 and connected with the control unit 16. The agent addition control valve of the water quality regulating unit 21 serves to control the amount of the agent released from the receiving space 212 into the liquid reservoir 104. Alternatively, the agent addition control valve is for a user (not shown) to manually or automatically control the amount of the agent released from the receiving space 212 into the liquid reservoir 104. In a preferred embodiment, the first fluid pipeline 191 between the agent outlet 213 and the mating opening 105 is omitted. The agent outlet 213 of the water quality regulating unit 21 is a protruding end directly inserted into the mating opening 105 and tightly connected therewith.

The control unit 16 is connected with the sensation unit 15 and the first pump 102. In this embodiment, the control unit 16 is, but not limited to, a programmable logic controller (PLC). In practice, the control unit 16 can be alternatively a digital signal controller (DSC) or a digital signal processor (DSP) or a microcontroller unit (MCU). The control unit 16 compares the sensation signal with a preset pH value range to generate a comparison result and transmit the comparison result to an external interface 30. Also, the water quality regulating unit 21 is manually controlled to release the agent or not to release the agent. Alternatively, according to the comparison result, the control unit 16 automatically controls the water quality regulating unit 21 to release the agent or not to release the agent. In this embodiment, the external interface 30 is a monitoring system. The external interface 30 is wirelessly or wiredly connected with the control unit 16 to receive the comparison result transmitted from the control unit 16. The preset pH value range can be pH1~pH14, and preferably pH5~pH6.5. In a preferred embodiment, the external interface 30 can be alternatively a display, a light-emitting component set, an intelligent mobile device or a speaker. The external interface 30 can display information, emit reminding sound (or alter sound) or emit reminding light (or alter light), whereby a user can real-time know the operation condition of the liquid-cooling heat dissipation system 1.

In this embodiment, the water quality regulating unit 21 is, but not limited to, automatically controlled by the control unit 16 to release the agent into the liquid reservoir 104 for illustration purposes. In practical application of the present invention, at proper time, a user can intervene to manually control the water quality regulating unit 21 to release the agent from the receiving space 212 (into) the liquid reservoir 104. Therefore, when the control unit 16 compares the pH value (such as pH7) of the sensation signal with a first preset pH value (such as pH6.5) in the preset Ph value range and finds that the pH value (such as pH7) of the sensation signal is greater than the first preset pH value (such as pH6.5), the control unit 16 will generate a comparison result of safety state. According to the comparison result, the control unit 16 controls the water quality regulating unit 21 not to release the agent (into) the liquid reservoir 104. Also, according to the comparison result transmitted from the control unit 16, the external interface 30 displays the comparison result via a display (not shown). Accordingly, from the comparison result information displayed by the display, the user can know that the water quality and pH value of the liquid-cooling heat dissipation system 1 in now in safety state. Therefore, the water quality can be real-time monitored.

When the control unit 16 compares the pH value of the sensation signal with the first preset pH value (such as pH6.5) and a second preset pH value (such as pH6.0) in the preset Ph value range and finds that the pH value (such as pH6.3) of the sensation signal is smaller than the first preset pH value (such as pH6.5) and greater than the second preset pH value (such as pH6.0), the control unit 16 will generate a comparison result of a first alert state (such as yellow alert state). According to the comparison result, the control unit 16 controls the water quality regulating unit 21 to release a predetermined first dose (such as 20 mg) of agent into the liquid reservoir 104. The agent contacts and mixes with the first working liquid 51. After mixed, the pH value sensor 151 will detect the pH value of the first working liquid 51 to transmit a pH value sensation signal (such as pH6.6). The control unit 16 compares the pH value of the sensation signal (such as pH6.6) with the first preset pH value (such as pH6.5) and the second preset pH value (such as pH6.0) to generate a comparison result of safety state. According to the comparison result, the control unit 16 controls the water quality regulating unit 21 not to release the agent into the liquid reservoir 104. Also, according to the comparison result transmitted from the control unit 16, the external interface 30 displays the comparison result via the display. Accordingly, from the comparison result information displayed by the display, the user can know that the water quality and pH value of the liquid-cooling heat dissipation system 1 is now converted from the first alert state into the safety state. In addition, the display of the external interface 30 can display the pH value (such as pH6.6) of the first working liquid mixed with the predetermined first dose (such as 20 mg) of agent. Therefore, at proper time, a user can manually control the water quality regulating unit 21 to further release a complex agent (or other predetermined dose (such as 45 mg or 55 mg) of agent) into the liquid reservoir 104 so as to increase the pH value concentration (such as pH6.9) of the first working liquid and increase the anti-boiling, anticorrosion and antirust functions of the first working liquid 51.

When the control unit 16 compares the pH value (such as pH5.5) of the sensation signal with the second preset pH value (such as pH6.0) and a third preset pH value (such as pH5.0) in the preset pH value range and finds that the pH value (such as pH5.5) of the sensation signal is smaller than the second preset pH value (such as pH6.0) and greater than the third preset pH value (such as pH5.0), the control unit 16 will generate a comparison result of a second alert state (such as red alert state). According to the comparison result, the control unit 16 adjusts and controls the water quality regulating unit 21 to release a predetermined second dose (such as 80 mg) of agent into the liquid reservoir 104. The agent contacts and mixes with the first working liquid 51. After mixed, the pH value sensor 151 will detect the pH value of the first working liquid 51 to transmit a pH value sensation signal (such as pH7.3). The control unit 16 compares the pH value of the sensation signal (such as pH7.3) with the first preset pH value (such as pH6.5) and the second preset pH value (such as pH6.0) and the third preset pH value (such as pH5.0) to generate a comparison result of safety state. According to the comparison result, the control unit 16 controls the water quality regulating unit 21 not to release the agent into the liquid reservoir 104. Also, according to the comparison result transmitted from the control unit 16, the external interface 30 displays the comparison result via the display. Accordingly, from the comparison result information displayed by the display, the user can know that the water quality and pH value of the liquid-cooling heat dissipation system 1 is now sequentially converted from the second alert state into the first alert state and into the safety state. The predetermined first dose (such as 20 mg or 71 mg) of agent is smaller than the predetermined second dose (such as 80 mg or 135 mg) of agent.

When the control unit 16 compares the pH value (such as pH4.9) of the sensation signal with the third preset pH value (such as pH5.0) in the preset pH value range and finds that the pH value (such as pH4.9) of the sensation signal is smaller than the third preset pH value (such as pH5.0), the control unit 16 will generate a comparison result of shut-down. According to the comparison result, the control unit 16 controls the water quality regulating unit 21 not to release the agent. Also, according to the comparison result transmitted from the control unit 16, the external interface 30 displays the comparison result via the display and transmits a shut-down signal to the control unit 16 of the liquid-cooling heat dissipation system 1. According to the shut-down signal, the control unit 16 controls such as the first pump 102 to stop operating. Therefore, from the comparison result information displayed by the display, the user can know that the water quality and pH value of the liquid-cooling heat dissipation system 1 is now in shut-down state.

In a preferred embodiment, the cabinets 60 and the external water supply apparatus 40 such as an icy water mainframe can be connected with two liquid-cooling heat dissipation systems 1. One of the liquid-cooling heat dissipation systems 1 serves as a backup. When the currently operating liquid-cooling heat dissipation system 1 receives the shut-down signal transmitted from the external interface 30 to stop operating, the external interface 30 will simultaneously transmit an actuation signal to control the other liquid-cooling heat dissipation system 1 to start operating so as to continuously perform water-cooling circulation heat dissipation for the IT apparatuses of the cabinets 60. In a modified embodiment, the external interface 30 not only can display the received comparison result information via the display, but also can transmit an operation message (such as comparison result information) of the liquid-cooling heat dissipation system 1 corresponding to an exclusive computer facility to an intelligent mobile device (such as a cellular phone or a tablet) of a remote end user by way of text, email, APP message or communication software. Accordingly, the user can real-time realize the operation conditions of the liquid-cooling heat dissipation systems 1 of the cabinets 60 in the respective computer facilities.

By means of the liquid-cooling heat dissipation system 1 of the present invention, the liquids can heat-exchange with each other. Also, the operation conditions in the liquid-cooling heat dissipation system 1 can be automatically monitored and controlled, (including the functions of automatically monitoring/controlling water quality and pH value, regulating water quality and pH value and automatically transmitting reminding or alert messages). Therefore, the liquid-cooling heat dissipation system 1 of the present invention can be so-called as an intelligent liquid-to-liquid heat exchange system (LTLCDU). In a preferred embodiment, as shown in FIG. 3A, the second liquid inlet 13 and the second liquid outlet 14, the second working liquid 52, the second fluid pipeline 192 and the external water supply apparatus 40 (such as an icy water mainframe) of the liquid-cooling heat dissipation system 1 are omitted. Instead, a fan set 70 having multiple fans is disposed on one side of the heat exchanger 101 of the liquid-cooling heat dissipation system 1 (or the other side of the heat exchanger 101) corresponding to the first liquid inlet 101 and correspondingly connected with the control unit 16. By means of the heat exchanger 101, (such as the high-temperature first working liquid 51 of the first liquid inlet 11) heat-exchanges with the cold wind forcedly exhausted from the fan set 70, whereby the heat of the high-temperature first working liquid 51 is carried away to lower the temperature (or cool) the high-temperature first working liquid 51 into low-temperature first working liquid 51 to flow into the liquid reservoir 104 for storage. Then, by means of the first pump 102, the low-temperature first working liquid 51 in the liquid reservoir 104 is exhausted from the first liquid outlet 12 into the cabinet 60 to continue the water-cooling circulation for dissipating the heat. Therefore, by means of the liquid-cooling heat dissipation system 1 of the present invention, the liquid can heat-exchange with the air. Also, the operation conditions in the liquid-cooling heat dissipation system 1 can be automatically monitored and controlled, the water quality and pH value can be automatically regulated and the reminding or alert messages can be automatically transmitted. Therefore, the liquid-cooling heat dissipation system 1 of the present invention can be so-called as an intelligent liquid-to-air heat exchange system (LTACDU).

The liquid-cooling heat dissipation system 1 further includes a power supply unit 17 and a flow amount control unit 18. The power supply unit 17 is electrically connected with the control unit 16, the sensation unit 15, the flow amount control unit 18, the water quality regulating unit 21 and the first pump 102 to supply power for use. The control unit 16 is electrically connected with the flow amount control unit 18. The flow amount control unit 18 is disposed in a proper position in the liquid-cooling heat dissipation system 1 for controlling the flow amount of the first working liquid 51 flowing within the multiple first fluid pipelines 191. The flow amount control unit 18 has at least one water control valve 181. In this embodiment, the water control valve 18 is, but not limited to, disposed in the second fluid pipeline 192 in adjacency to the second liquid inlet 13. The position where the flow amount control unit 18 is disposed is not limited. In a modified embodiment, the flow amount control unit 18 can be disposed in the first fluid pipeline 191 in adjacency to the first liquid inlet 11 (or the first liquid outlet 12). Therefore, the external interface 30 receives the temperature sensation signal transmitted from the control unit 16 and display the detected temperature value on the display, whereby at proper time, the user can transmit a control signal to the control unit 16 via the external interface 30. According to the control signal, the control unit 16 controls the water control valve 181 to control the water flow amount of the second liquid inlet 13.

Therefore, by means of the design of the liquid-cooling heat dissipation system 1 of the present invention, the water quality (such as water quality and pH value) can be monitored and controlled and the agent can be added manually or automatically at proper time so as to regulate and control the water quality and prolong the lifetime of the liquid-cooling heat dissipation system and enhance the heat exchange efficiency. Also, the liquid-cooling heat dissipation system 1 of the present invention has alert and reminding function and is able to control the water flow amount of the working liquids and has the function of automatically supplementing water and has the effect of monitoring/controlling system pressure.

Figure 4:
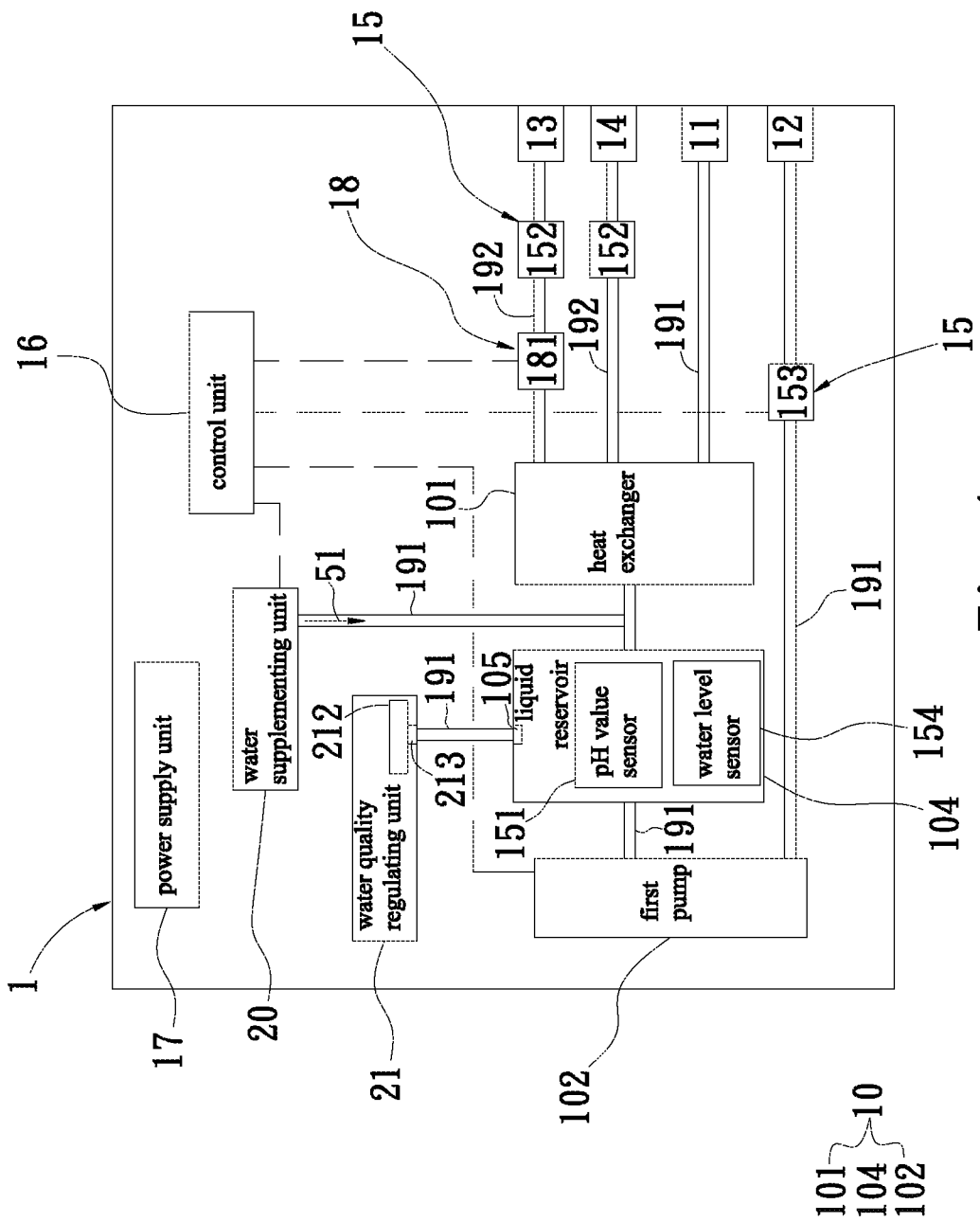
FIG. 4 is a block diagram of a second embodiment of the liquid-cooling heat dissipation system of the present invention.
Figure 5:
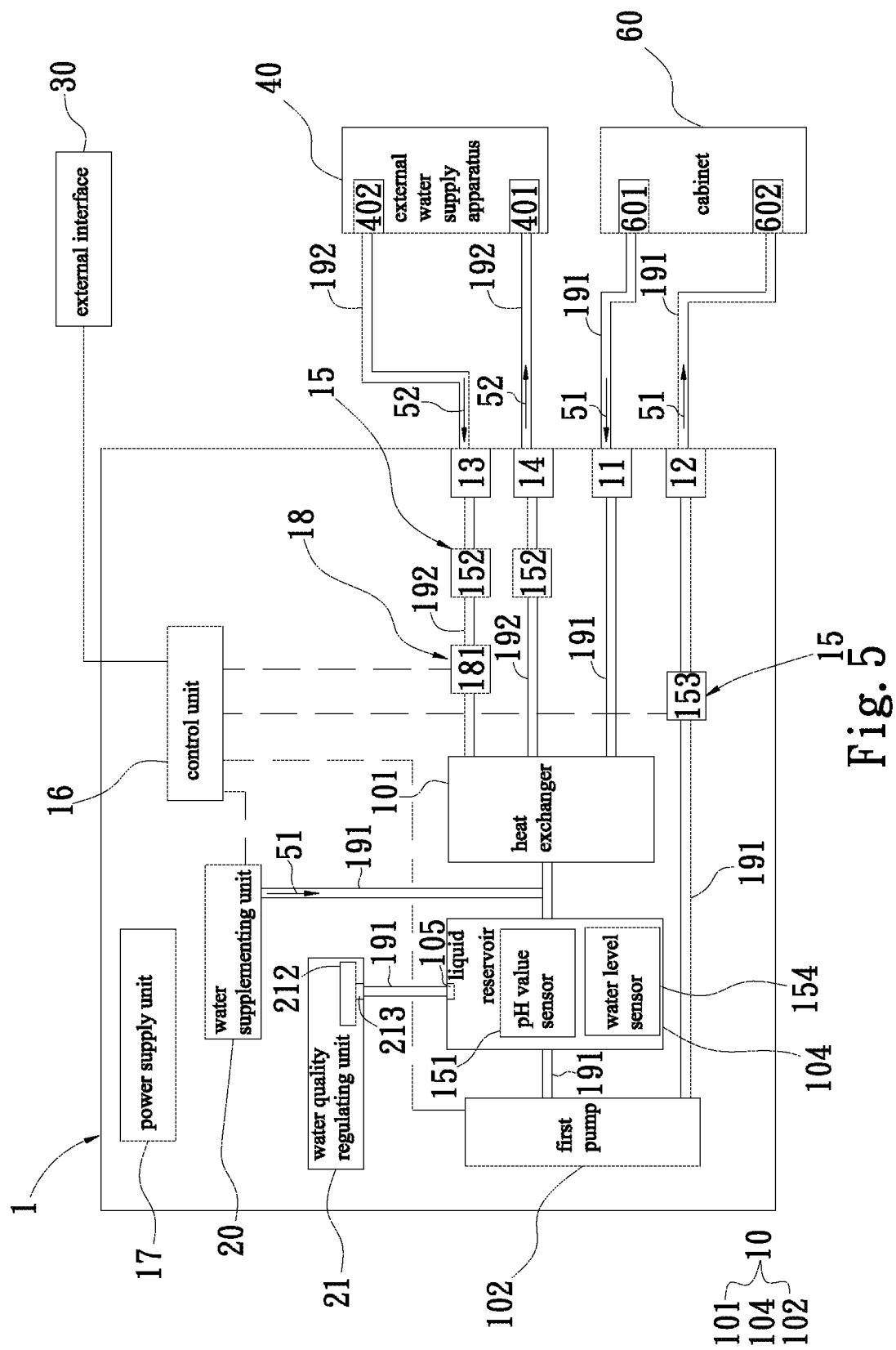
FIG. 5 is a block diagram of the second embodiment of the liquid-cooling heat dissipation system of the present invention, showing an application thereof.

Please now refer to FIGS. 4 and 5. FIG. 4 is a block diagram of a second embodiment of the liquid-cooling heat dissipation system of the present invention. FIG. 5 is a block diagram of the second embodiment of the liquid-cooling heat dissipation system of the present invention, showing the application thereof. The second embodiment is substantially identical to the first embodiment in structure, connection relationship and effect and thus will not be redundantly described hereinafter. The second embodiment is different from the first embodiment in that the sensation unit 15 has at least one pressure sensor 152. In this embodiment, the mating opening 105 of the heat exchange unit 10 of the first embodiment is changed to be disposed on the first fluid pipeline 191 in adjacency to the first liquid inlet 11 and correspondingly mated with the agent outlet 213 of the water quality regulating unit 21. Therefore, the high-temperature first working liquid 51 passing through the first fluid pipeline 191 in adjacency to the first liquid inlet 11 can more effectively, quickly and uniformly contact and mix with the agent.

The pressure sensor 152 is disposed in a place where the working liquids (such as the first and second working liquids 51, 52) pass through to measure the pressure in the pipelines 193 of the liquid-cooling heat dissipation system 1. For example, the pressure sensor 152 serves to detect at least one of the first liquid inlet 11 (or the second liquid inlet 13) and the first liquid outlet 12 (or the second liquid outlet 14) and the multiple first fluid pipelines 191 (or the second fluid pipelines 192) to obtain a pressure sensation signal. In this embodiment, there are two pressure sensors 152 respectively correspondingly disposed in the second fluid pipeline 192 in adjacency to the second liquid inlet 13 and the second fluid pipeline 192 in adjacency to the second liquid outlet 14 so as to measure the pressure value of the low-temperature second working liquid 52 entering the second liquid inlet 13 and the pressure value of the high-temperature second working liquid 52 exhausted from the second liquid outlet 14. The pressure sensors 152 transmit the pressure values to the control unit 16. The control unit 16 receives the pressure values and transmits the pressure values to the external interface 30 (such as monitoring/controlling system) to display the pressure values. Accordingly, a user can adjust or control the operation in the liquid-cooling heat dissipation system.

In addition, the liquid-cooling heat dissipation system 1 further includes a water supplementing unit 20. The control unit 16 is electrically connected with the water supplementing unit 20. The water supplementing unit 20 is correspondingly connected with one of the multiple first fluid pipelines 191. The water supplementing unit 20 serves to supplement the coolant, (that is, the first working liquid 51). At least one water level sensor 154 is disposed in the liquid reservoir 104. When the water level sensor 154 detects that the water level in the liquid reservoir 104 is lower than a set water amount, the water level sensor 154 will transmit a water level sensation signal to the control unit 16. The control unit 16 controls a water control valve (not shown) on the water supplementing unit 20 to open, whereby the water supplementing unit 20 will supplement water (such as supplement the coolant) until the water level sensor 154 detects that the liquid reservoir 104 is supplemented with the water to reach a set water amount. At this time, the control unit 16 controls the water control valve on the water supplementing unit 20 to close and stop supplementing water. Accordingly, the water can be automatically supplemented. In addition, in practical application of the present invention, during the automatic water supplementing process, the original pH value concentration of the first working liquid 51 will be diluted (or raised). Therefore, the control unit 16 will compare the sensation signal transmitted from the pH value sensor 151 with the preset pH value range to generate a comparison result. According to the comparison result, the water quality regulating unit 21 is properly adjusted and controlled to release the agent into the liquid reservoir 104. Therefore, after supplemented with water, the first working liquid 51 in the liquid reservoir 104 can reach the preset pH value range.

In a modified embodiment, the water supplementing unit 20 can be disposed in a proper position in the liquid-cooling heat dissipation system 1 to supplement the liquid-cooling heat dissipation system 1 with the first working fluid 51 at proper time. For example, the water supplementing unit 20 can be disposed in a position in adjacency to the liquid reservoir 104 and connected with the liquid reservoir 104 via a pipeline (not shown) to directly supplement the liquid reservoir 104 with water.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A liquid-cooling heat dissipation system capable of regulating water quality, comprising:
a first liquid inlet;
a first liquid outlet;
a heat exchange unit having a mating opening, a heat exchanger communicating with the first liquid inlet and a first pump communicating with the first liquid outlet and the heat exchanger, the first pump serving to drive a first working liquid, which has been heat-exchanged in the heat exchanger;
a sensation unit, the sensation unit having at least one pH value sensor disposed in a place where the first working liquid passes through for detecting the pH value of the first working liquid and generating a sensation signal corresponding to the pH value;
a water quality regulating unit connected with the mating opening, the water quality regulating unit being manually or automatically operable to control and release an agent contained in the water quality regulating unit to pass through the mating opening into the heat exchange unit, whereby the agent contacts and mixes with the first working liquid; and
a control unit connected with the sensation unit and the first pump, the control unit serving to compare the sensation signal with a preset pH value range to generate a comparison result and transmit the comparison result to an external interface, whereby the water quality regulating unit is manually controlled to release the agent or not to release the agent, alternatively, according to the comparison result, the control unit automatically controlling the water quality regulating unit to release the agent or not to release the agent.

2. The liquid-cooling heat dissipation system capable of regulating water quality as claimed in claim 1, wherein the water quality regulating unit has a receiving space for receiving the agent and an agent outlet connected with the mating opening, the receiving space respectively communicating with the agent outlet and the mating opening, the agent outlet being for releasing the agent into the mating opening.

3. The liquid-cooling heat dissipation system capable of regulating water quality as claimed in claim 2, wherein the heat exchange unit has a liquid reservoir containing the first working liquid, the liquid reservoir being respectively connected with the heat exchanger and the first pump, the first liquid outlet and the first liquid inlet being respectively correspondingly connected with the first pump and the heat exchanger via multiple first fluid pipelines to communicate therewith, the pH value sensor being disposed in the liquid reservoir or any of the multiple first fluid pipelines.

4. The liquid-cooling heat dissipation system capable of regulating water quality as claimed in claim 3, wherein the mating opening is disposed on one side of the liquid reservoir, the agent outlet of the water quality regulating unit communicating with an interior of the liquid reservoir via the mating opening, whereby the agent is released from the receiving space through the mating opening into the liquid reservoir.

5. The liquid-cooling heat dissipation system capable of regulating water quality as claimed in claim 1, wherein the heat exchange unit has a second pump, the second pump being connected with the first pump in parallel or serially.

6. The liquid-cooling heat dissipation system capable of regulating water quality as claimed in claim 1, further comprising a power supply unit, the power supply unit being electrically connected with the control unit, the sensation unit and the first pump to supply power for use.

7. The liquid-cooling heat dissipation system capable of regulating water quality as claimed in claim 1, wherein the sensation unit has at least one pressure sensor, the pressure sensor serving to detect at least one of the first liquid inlet and the first liquid outlet and the multiple first fluid pipelines to obtain a pressure sensation signal.

8. The liquid-cooling heat dissipation system capable of regulating water quality as claimed in claim 1, wherein in case the control unit compares the pH value of the sensation signal with a first preset pH value in the preset Ph value range and finds that the pH value of the sensation signal is greater than the first preset pH value, the control unit generates a comparison result of safety state, whereby according to the comparison result, the control unit controls the water quality regulating unit not to release the agent.

9. The liquid-cooling heat dissipation system capable of regulating water quality as claimed in claim 1, wherein in case the control unit compares the pH value of the sensation signal with the first preset pH value and a second preset pH value in the preset Ph value range and finds that the pH value of the sensation signal is smaller than the first preset pH value and greater than the second preset pH value, the control unit generates a comparison result of a first alert state, whereby according to the comparison result, the control unit controls the water quality regulating unit to release a predetermined first dose of agent until the control unit again receives and generates a comparison result of safety state, whereby according to the comparison result, the control unit controls the water quality regulating unit not to release the agent.

10. The liquid-cooling heat dissipation system capable of regulating water quality as claimed in claim 9, wherein in case the control unit compares the pH value of the sensation signal with the second preset pH value and a third preset pH value in the preset pH value range and finds that the pH value of the sensation signal is smaller than the second preset pH value and greater than the third preset pH value, the control unit generates a comparison result of a second alert state, whereby according to the comparison result, the control unit adjusts and controls the water quality regulating unit to release a predetermined second dose of agent until the control unit again receives and generates a comparison result of safety state, whereby according to the comparison result, the control unit controls the water quality regulating unit not to release the agent, when the control unit compares the pH value of the sensation signal with the third preset pH value in the in the preset pH value range and finds that the pH value of the sensation signal is smaller than the third preset pH value, the control unit generating a comparison result of shut-down state, whereby according to the comparison result, the control unit controls the water quality regulating unit not to release the agent.

11. The liquid-cooling heat dissipation system capable of regulating water quality as claimed in claim 10, wherein the preset first dose of agent is smaller than the preset second dose of agent.

12. The liquid-cooling heat dissipation system capable of regulating water quality as claimed in claim 1, wherein the external interface is selected from a group consisting of a monitoring system, a display, a light-emitting component set, an intelligent mobile device and a speaker.

13. The liquid-cooling heat dissipation system capable of regulating water quality as claimed in claim 1, wherein the external interface is wirelessly or wiredly connected with the control unit.

14. The liquid-cooling heat dissipation system capable of regulating water quality as claimed in claim 1, wherein the control unit is selected from a group consisting of a programmable logic controller, a digital signal controller, a digital signal processor and a microcontroller unit.

15. The liquid-cooling heat dissipation system capable of regulating water quality as claimed in claim 1, wherein the heat exchanger is a plate-type heat exchanger.

16. The liquid-cooling heat dissipation system capable of regulating water quality as claimed in claim 1, further comprising a second liquid inlet and a second liquid outlet, the heat exchanger being respectively correspondingly connected with the second liquid inlet and the second liquid outlet via multiple second fluid pipelines to communicate therewith, via the second fluid pipelines, the second liquid inlet and the second liquid outlet being connected with an external water supply apparatus for providing a second working liquid.

17. The liquid-cooling heat dissipation system capable of regulating water quality as claimed in claim 1, wherein the agent is selected from a group consisting of liquid agent, tablet agent, powder agent, particle agent and paste agent.

18. The liquid-cooling heat dissipation system capable of regulating water quality as claimed in claim 1, wherein the agent is a pH value agent or a complex agent, the complex agent being selected from a group consisting of pH value and anticorrosion complex agent, pH value and anti-boiling complex agent and pH value, anticorrosion, anti-boiling and antirust complex agent.

* * * * *